(12) United States Patent
Kaneko et al.

(10) Patent No.: US 6,589,699 B2
(45) Date of Patent: *Jul. 8, 2003

(54) PHOTOMASK BLANK AND PHOTOMASK

(75) Inventors: Hideo Kaneko, Niigata-ken (JP); Yukio Inazuki, Niigata-ken (JP); Satoshi Okazaki, Niigata-ken (JP)

(73) Assignee: Shin-Etsu Chemical Co., Ltd. (JP)

( * ) Notice: Subject to any disclaimer, the term of this patent is extended or adjusted under 35 U.S.C. 154(b) by 134 days.

This patent is subject to a terminal disclaimer.

(21) Appl. No.: 09/840,097

(22) Filed: Apr. 24, 2001

(65) Prior Publication Data

US 2001/0044054 A1 Nov. 22, 2001

(30) Foreign Application Priority Data

Apr. 25, 2000 (JP) ........................... 2000-124276

(51) Int. Cl.[7] ................................. G03F 9/00
(52) U.S. Cl. .............................................. 430/5
(58) Field of Search ..................... 430/5, 322, 323; 428/428

(56) References Cited

U.S. PATENT DOCUMENTS

| 4,363,846 A | 12/1982 | Kaneki |
| 4,374,912 A | 2/1983 | Kaneki et al. |
| 4,530,891 A | 7/1985 | Nagarekawa et al. |
| 4,563,407 A | 1/1986 | Matsui et al. |
| 4,657,648 A | 4/1987 | Nagarekawa et al. |
| 4,696,877 A | 9/1987 | Matsui et al. |
| 5,538,816 A | * 7/1996 | Hashimoto et al. ............ 430/5 |
| 5,830,605 A | 11/1998 | Umeki et al. |

FOREIGN PATENT DOCUMENTS

| EP | 04009847 | 1/1992 |
| EP | 0643331 A2 | 3/1995 |
| EP | 0872767 A2 | 10/1998 |
| EP | 1116999 A1 | 7/2001 |
| EP | 1117000 A2 | 7/2001 |
| EP | 1130466 A2 | 9/2001 |
| JP | 61-46821 | 10/1986 |
| JP | 62-27386 | 6/1987 |
| JP | 62-27387 | 6/1987 |
| JP | 62-32782 | 7/1987 |
| JP | 62-37385 | 8/1987 |

OTHER PUBLICATIONS

English abstract of JP 62–37385.
English abstract of JP 62–27386.

* cited by examiner

Primary Examiner—S. Rosasco
(74) Attorney, Agent, or Firm—Millen, White, Zelano, Branigan, P.C.

(57) ABSTRACT

A photomask blank comprising a transparent substrate on which are formed at least one light-shielding film and at least one antireflective film minimizes film stress and eliminates substrate warp following deposition of the light-shielding film and the antireflective film, when each film is composed of a CrCO layer, a CrCON layer, or a combination of CrCO and CrCON layers. The photomask blank can be accurately patterned without distortion to give a photomask.

20 Claims, 3 Drawing Sheets

PHOTOMASK BLANK AND PHOTOMASK

BACKGROUND OF THE INVENTION

1. Field of the Invention

The present invention relates to a photomask blank and a photomask for use in photolithography. More specifically, it relates to a photomask blank and photomask which are well suited for use in the microfabrication of high-density semiconductor integrated circuits such as large-scale integration (LSI) and very large-scale integration (VLSI) chips, charge-coupled devices, color filters for liquid-crystal displays, and magnetic heads.

2. Prior Art

Photolithographic processes involving the use of photomasks are employed in the fabrication of LSI and VLSI chips, charge-coupled devices, color filters for liquid-crystal displays, and magnetic heads. Photomasks used for this purpose are produced from a photomask blank composed of a transparent substrate such as silica glass or aluminosilicate glass on which a generally chromium-based light-shielding film has been formed by a sputtering or vacuum evaporation technique. The photomask is created by forming a specific pattern in the light-shielding film of the photomask blank.

Patterning is carried out by applying a photoresist or an electron-beam resist to the photomask blank composed of a chromium-based light-shielding film on a substrate, selectively exposing the resist to a specific light pattern, and subjecting the resist to development, rinsing and drying steps so as to form a resist pattern. Using the resulting resist pattern as a mask, the unmasked areas of the chromium-based film are removed, either by wet etching with an etchant composed of an aqueous solution of both cerium ammonium nitrate and perchloric acid, or by dry etching with a chlorine-containing gas. The resist is then removed to give a photomask having a specific pattern composed of light-shielding areas and light-transmitting areas.

The chromium-based light-shielding film has a high light reflectance. To prevent light which reflects back from the semiconductor substrate being exposed and passes through the projection lens from being reflected again by the photomask and returning to the semiconductor substrate, an antireflective coating is generally formed on the surface side, or both the surface and back sides, of the light-shielding film.

Photomasks and photomask blanks having such an antireflective coating are described in the prior art. For example, JP-B 62-37385 discloses a photomask blank comprising a transparent substrate on which have been successively formed a chromium carbide nitride film containing chromium carbide and chromium nitride as a back antireflective coating, a chromium film as a light-shielding film, and a chromium oxide nitride film containing chromium oxide and chromium nitride as a surface antireflective coating. The prior art also teaches the use of CrON (JP-B 61-46821 and JP-B 62-32782) as the antireflective coating, and the use of chromium (JP-B 61-46821), CrC (JP-B 62-27387) or CrN (JP-B 62-27386 and JP-B 62-27387) as the light-shielding film.

In addition, photomask blanks have been developed for commercial use in which a chromium-based film is formed over a halftone film in order to increase resolution.

An important requirement of photomasks is that the substrate be flat to assure accurate transfer of the pattern. Yet, no matter how flat a substrate is used, forming two, three or more chromium-based films on the substrate increases film stress within the plurality of layers, causing the substrate to warp following film formation and thus lowering surface flatness. Moreover, even if a substrate in which the surface flatness has changed due to stresses within the applied films is flat after the films have been formed, subsequent patterning and selective removal of the chromium-based films alters the flatness of the substrate and causes it to warp. As a result, when a specific mask pattern on such a photomask is transferred onto a workpiece such as a silicon substrate, pattern distortion arises.

Lately, as the level of integration and miniaturization of semiconductor integrated circuit devices has continued to rise and the geometries of circuit patterns formed on semiconductor substrates have become ever smaller, rapid advances are being made in achieving smaller feature sizes in photomask patterns as well. One serious and unwelcome consequence is that substrate warp due to film stress following film formation can result in pattern formation on the workpiece at a position other than that intended. The incidence of such positional deviation due to warping of the photomask substrate rises as the minimum feature size of pattern becomes smaller, and is an especially grave problem with very small patterns.

SUMMARY OF THE INVENTION

It is therefore an object of the invention to provide a high-performance photomask blank comprising a transparent substrate on which have been formed a light-shielding film and an antireflective film, in which photomask blank the substrate does not warp due to film stress following film formation, thus enabling a desired finely featured pattern to be formed thereon accurately and without distortion. Another object of the invention is to provide a photomask fabricated by patterning the foregoing blank.

The inventor has found that, in photomasks or photomask blanks which comprise a transparent substrate having thereon at least one light-shielding film and at least one antireflective film, by forming each film from a CrCO layer, a CrCON layer, or a combination of CrCO and CrCON layers, these CrCON layers and CrCO layers have smaller film stresses than conventional chromium films, resulting in minimal change in substrate warp after formation of the light-shielding film and the antireflective film relative to before film formation. Hence, photomask blanks and photomasks having a high degree of surface flatness can be obtained.

Accordingly, the invention provides a photomask blank comprising a transparent substrate and, on the substrate, at least one light-shielding film and at least one antireflective film; wherein each film is composed of a CrCO layer, a CrCON layer, or a combination of CrCO and CrCON layers.

According to one preferred embodiment of the invention, the photomask blank has, in order from the substrate side, a CrCO layer as the light-shielding film and a CrCON layer as the antireflective film.

According to another preferred embodiment, the photomask blank has, in order from the substrate side, a CrCON layer as the light-shielding film and a CrCON layer as the antireflective film.

According to yet another preferred embodiment, the photomask blank has, in order from the substrate side, a CrCON layer as a first antireflective film, a CrCO layer as the light-shielding film and a CrCON layer as a second antireflective film.

According to still another preferred embodiment, the photomask blank has, in order from the substrate side, a CrCON layer as a first antireflective film, a CrCON layer as the light-shielding film, and a CrCON layer as a second antireflective film.

Preferably, the light-shielding film and antireflective film have a combined film stress of not more than 0.2 GPa. Moreover, the substrate in the photomask blank of the invention undergoes a change in warp following deposition of the light-shielding film and the antireflective film, relative to before film deposition, of preferably not more than 0.2 μm.

The invention also provides a photomask fabricated by lithographically patterning the foregoing photomask blank.

The inventive photomask blank and photomask which comprise, on a transparent substrate, at least one light-shielding film and at least one antireflective film, each of which is composed of a CrCO layer, a CrCON layer, or a combination of CrCO and CrCON layers, have very low film stresses. Hence, the substrate does not warp following formation of the light-shielding film and the antireflective film, making it possible to accurately form without distortion a desired pattern of small feature size. As a result, the photomask blanks and photomasks according to the invention are fully capable of meeting the technical demands of even higher levels of integration and miniaturization in semiconductor integrated circuit devices.

The CrCO and CrCON layers in the invention can be deposited using as the sputtering gas $CO_2$, which is safer than CO. Because $CO_2$ gas has a lower reactivity than other gases such as oxygen gas, it can spread uniformly through much of the chamber, thus helping to achieve CrCO and CrCON layers of uniform quality.

BRIEF DESCRIPTION OF THE DRAWINGS

The objects, features and advantages of the invention will become more apparent from the following detailed description, taken in conjunction with the accompanying drawings.

FIG. 5 is a series of schematic sectional views illustrating a photomask manufacturing method such as may be used in connection with the invention.

DETAILED DESCRIPTION OF THE INVENTION

Figure 1:
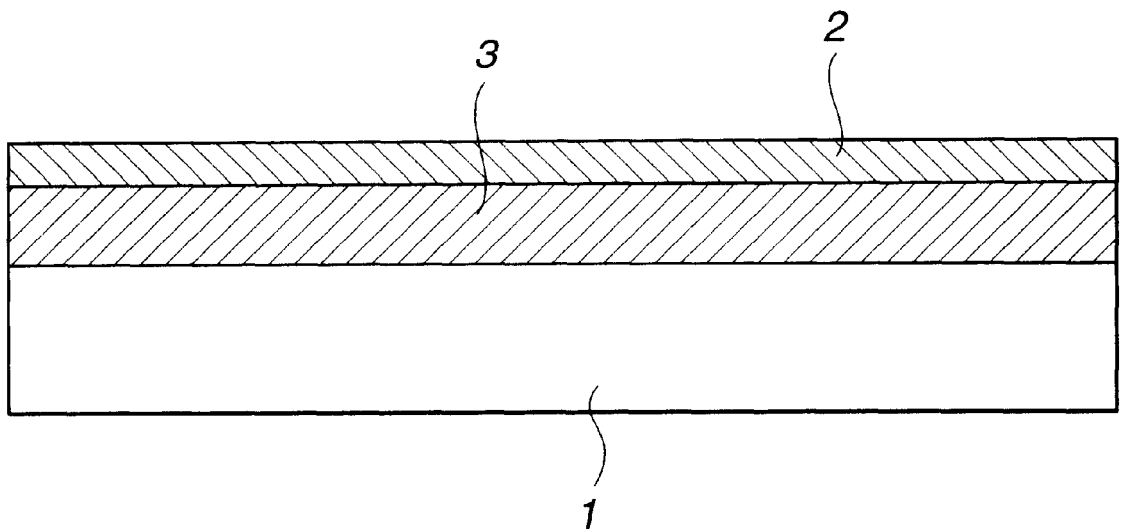
FIG. 1 is a sectional view of a photomask blank according to one embodiment of the invention.
Figure 3:
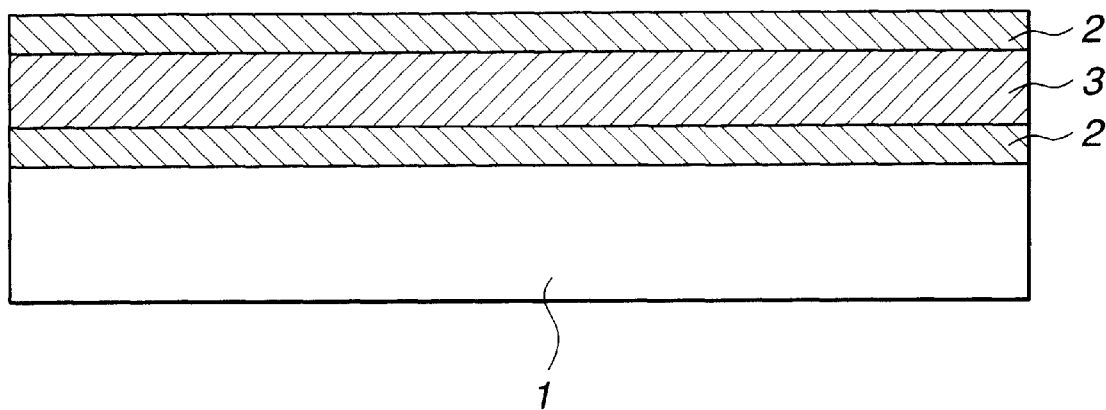
FIG. 3 is a sectional view of a photomask blank according to another embodiment of the invention.

Referring to FIGS. 1 and 3, the photomask blank of the invention includes at least one light-shielding film 3 and at least one antireflective film 2 on a substrate 1. The substrate 1 is made of a material such as quartz or $CaF_2$ that is transparent to the exposure light. Each light-shielding film 3 and antireflective film 2 is composed of a CrCO layer, a CrCON layer, or a combination of CrCO and CrCON layers.

In a photomask blank having a two-layer film structure composed of one light-shielding film and one antireflective film, it is preferable for the films to be formed in order as shown in FIG. 1, starting with the light-shielding film 3 on the substrate 1 and followed by the antireflective film 2 on the light-shielding film 3.

Such a two-layer film structure has four possible combinations:

(1) a CrCON layer as the light-shielding film with a CrCON layer as the antireflective film;
(2) a CrCO layer as the light-shielding film with a CrCO layer as the antireflective film;
(3) a CrCON layer as the light-shielding film with a CrCO layer as the antireflective film; and
(4) a CrCO layer as the light-shielding film with a CrCON layer as the antireflective film.

Of these, the preferred structures are (1) a structure having, in order from the substrate side, a CrCON layer as the light-shielding film and a CrCON layer as the antireflective film; and (2) a structure having, in order from the substrate side, a CrCO layer as the light-shielding film and a CrCON layer as the antireflective film.

In a photomask blank having a three-layer film structure composed of one light-shielding film and two antireflective films, it is preferable for the films to be formed in order as shown in FIG. 3, starting with the first antireflective layer 2 on the substrate 1, and followed in turn by the light-shielding layer 3 on the first antireflective film 2, then the second antireflective film 2' on the light-shielding film 3.

Such a three-layer film structure has eight possible combinations:

(1) a CrCON layer as the first antireflective film, a CrCON layer as the light-shielding film, and a CrCON layer as the second antireflective film;
(2) a CrCON layer as the first antireflective film, a CrCO layer as the light-shielding film, and a CrCON layer as the second antireflective film;
(3) a CrCO layer as the first antireflective film, a CrCO layer as the light-shielding film, and a CrCO layer as the second antireflective film;
(4) a CrCO layer as the first antireflective film, a CrCON layer as the light-shielding film, and a CrCO layer as the second antireflective film;
(5) a CrCON layer as the first antireflective film, a CrCON layer as the light-shielding film, and a CrCO layer as the second antireflective film;
(6) a CrCO layer as the first antireflective film, a CrCO layer as the light-shielding film, and a CrCON layer as the second antireflective film;
(7) a CrCO layer as the first antireflective film, a CrCON layer as the light-shielding film, and a CrCON layer as the second antireflective film; and
(8) a CrCON layer as the first antireflective film, a CrCO layer as the light-shielding film, and a CrCO layer as the second antireflective film.

Of these, the preferred structures are (1) a structure having, in order from the substrate side, a CrCON layer as the first antireflective film, a CrCON layer as the light-shielding film, and a CrCON layer as the second antireflective film; and (2) a structure having, in order from the substrate side, a CrCON layer as the first antireflective film, a CrCO layer as the light-shielding film, and a CrCON layer as the second antireflective film.

Each CrCO film preferably has a composition consisting essentially of 1 to 20 atom % carbon and 5 to 60 atom % of oxygen, with the balance being chromium.

Each CrCON film preferably has a composition consisting essentially of 1 to 20 atom % carbon, 5 to 60 atom % oxygen, and 1 to 60 atom % nitrogen, with the balance being chromium.

The antireflective film typically has a thickness which is about λ/4n, where λ is the wavelength of the light used in the exposure tool such as a stepper, and n is the refractive index of the film. The light-shielding film should have a thickness which can sufficiently mask light. The thickness of the light-shielding layer is typically about 30 to 150 nm.

In the photomask blank of the invention, the overall film stress for all the light-shielding films and antireflective films combined is preferably not more than 0.2 GPa, and most preferably from 0 to 0.1 GPa. A film stress greater than 0.2 GPa may cause the substrate to warp following film formation, which can make accurate transfer of the pattern impossible. Moreover, because the inventive photomask blank has such a small film stress, the change in substrate warp after formation of the light-shielding film and the antireflective film on a 6-inch square substrate, for example, relative to before film formation, is typically not more than 0.2 $\mu$m, and preferably from 0 to 0.1 $\mu$m.

In the practice of the invention, the chromium oxide carbide (CrCO) and/or chromium oxide nitride carbide (CrCON) films may be successively deposited from the substrate side by a reactive sputtering process using chromium as the target.

The sputtering process may be one which employs a direct-current power supply (DC sputtering) or a high-frequency power supply (RF sputtering). Either a magnetron sputtering system or a conventional sputtering system may be used. DC sputtering is advantageous because the mechanism involved is simple, and a sputtering system which uses a magnetron sputtering target is preferred because film formation is more rapid, increasing productivity. The film-forming system may be either a continuous, in-line system or a single-workpiece processing system.

The sputtering gases introduced into the sputtering chamber during deposition of a CrCON film may be one each of a carbon-containing gas (e.g., $CH_4$, $CO_2$, and CO), a nitrogen-containing gas (e.g., NO, $NO_2$, and $N_2$) and an oxygen-containing gas (e.g., $CO_2$, NO, and $O_2$). Alternatively, a gas mixture obtained by mixing these gases with an inert gas (e.g., argon, neon and krypton) may be used. Using $CO_2$ gas as both the carbon and oxygen source gas is especially advantageous for uniformity in the plane of the substrate and for controllability during production. Each of the sputtering gases may be introduced separately into the sputtering chamber, or some or all of the gases may first be mixed together then introduced into the chamber.

The sputtering gases introduced into the sputtering chamber during deposition of a CrCO film may be one each of a carbon-containing gas (e.g., $CH_4$, $CO_2$, and CO) and an oxygen-containing gas (e.g., $CO_2$, and $O_2$). Alternatively, a gas mixture obtained by mixing these gases with an inert gas (e.g., argon, neon and krypton) may be used. Using $CO_2$ or a mixture of $CO_2$ with an inert gas as the sputtering gas is especially advantageous because it is safe and because $CO_2$ gas has a lower reactivity than other suitable gases such as oxygen, which enables the gas to spread uniformly through much the chamber and thus allows the CrCO film that forms to be of uniform quality. Each of the sputtering gases may be introduced separately into the sputtering chamber, or some or all of the gases may first be mixed together then introduced into the chamber.

The sputtering target need not be composed entirely of chromium so long as chromium is a major component. Examples of suitable targets include chromium targets which contain oxygen, nitrogen or carbon, and targets composed of chromium to which a combination of oxygen, nitrogen and carbon has been added.

Illustrative, non-limiting examples of the substrate used for film formation include transparent quartz, aluminosilicate glass, calcium fluoride and magnesium fluoride.

The film structure in the photomask blank of the invention is not limited only to a chromium-based two-layer or three-layer film structure. For example, the photomask blank may have instead a four-layer film structure. The film structure may further include a phase shifter film which changes the phase of light at the exposure light wavelength. The photomask blank of the invention may be adapted for the production of not only transmission-type masks, but also reflection-type masks.

Figure 2:
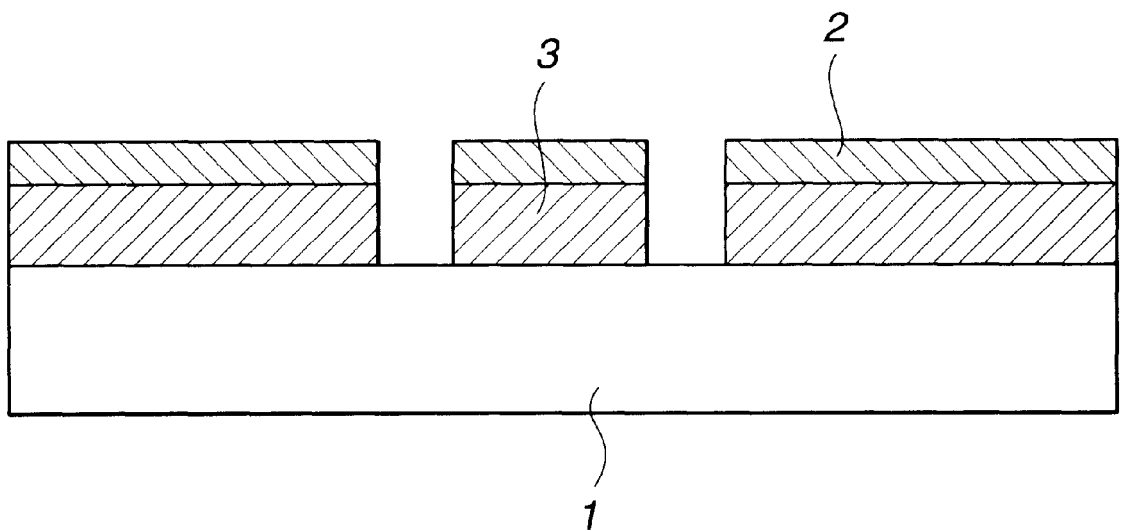
FIG. 2 is a sectional view of a photomask obtained from the photomask blank shown in FIG. 1.
Figure 4:
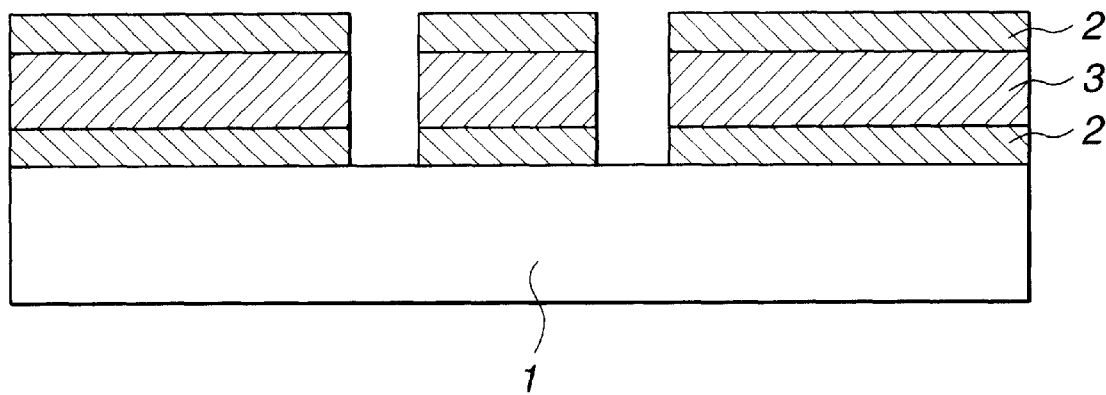
FIG. 4 is a sectional view of a photomask obtained from the photomask blank shown in FIG. 3.
Figure 5A:
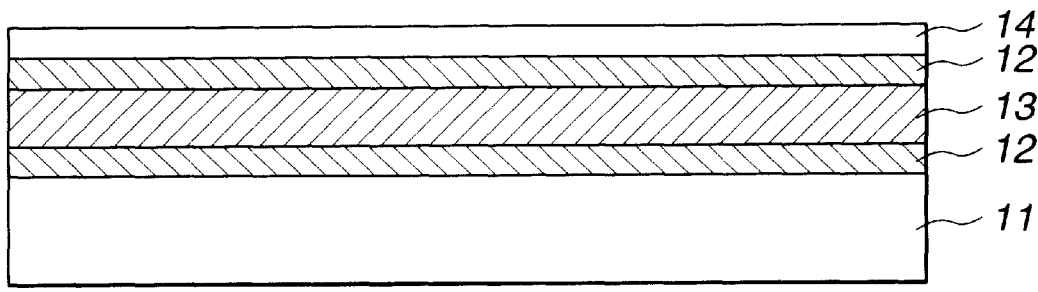
FIG. 5A shows a photomask blank on which a resist film has been formed.
Figure 5B:
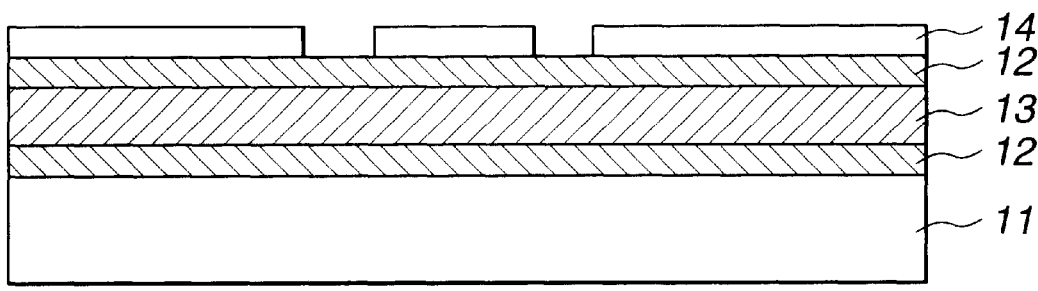
FIG. 5B shows the photomask workpiece after the resist film has been patterned.
Figure 5C:
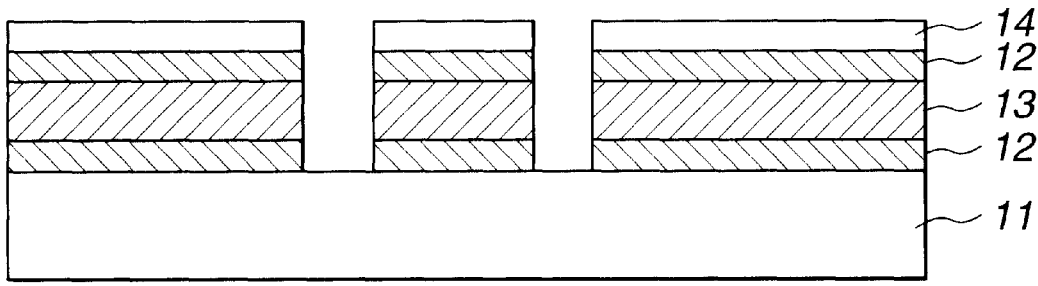
FIG. 5C shows the workpiece after dry etching or wet etching.
Figure 5D:
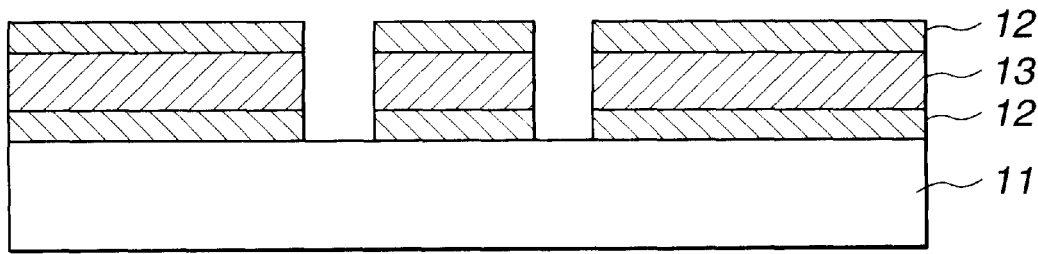
FIG. 5D shows the completed photomask after the resist film has been removed.

The inventive photomask blank obtained as described above is then patterned by a lithographic process to give a photomask having a two-layer or three-layer structure composed of CrCO and CrCON layers like those shown in FIGS. 2 and 4. Because the change in substrate warp after formation of the light-shielding film and the antireflective film, relative to before film formation, or after film removal during patterning relative to before film removal, is preferably less than 0.2 $\mu$m, and most preferably from 0 to 0.1 $\mu$m, accurate, distortion-free patterning is possible.

More specifically, using the photomask blank of the invention, a photomask may be manufactured by a process as shown in FIG. 5. A CrCON layer (or a CrCO layer) is formed as a first antireflective film 12 on a substrate 11, a CrCO layer (or a CrCON layer) is formed as a light-shielding film 13 on the first antireflective film 12, a CrCON layer (or a CrCO layer) is formed as a second antireflective film 12 on the light-shielding film 13, and a resist film 14 is formed on the second antireflective film 12 (FIG. 5A). Next, the resist film 14 is patterned (FIG. 5B). Then the first antireflective film 12, the second antireflective film 12' and the light-shielding film 13 are dry-etched or wet-etched (FIG. 5C). The resist film 14 is subsequently stripped (FIG. 5D). In this process, application of the resist film, patterning (exposure and development), dry or wet etching, and removal of the resist film may be carried out by known methods.

Because the photomask of the invention is substantially free of substrate warp following film deposition, desired patterns of a very small linewidth can be accurately formed. Hence, the inventive photomask is capable of meeting the technical demands of even higher levels of integration and miniaturization in semiconductor integrated circuit devices.

EXAMPLES

The following examples of the invention and comparative examples are provided by way of illustration, and not by way of limitation.

Example 1

A CrCO film was deposited to a thickness of 70 nm on a 6-inch quartz substrate by DC sputtering. Chromium was used as the target, and the gases passed through the system were argon (5 sccm) and $CO_2$ (0.4 sccm). Other sputtering conditions included a gas pressure during discharge of 0.3 Pa and a power of 130 W. The composition of the CrCO film, as determined by electron spectroscopy for chemical analysis (ESCA), was 69 atom % chromium, 13 atom % carbon and 18 atom % oxygen.

Next, a CrCON film was deposited to a thickness of 25 nm on the CrCO film by DC sputtering. Chromium was used as the target, and the gases passed through the system were argon (5 scam), $CO_2$ (1.2 scam) and $N_2$ (1.6 scam). Other sputtering conditions included a gas pressure during discharge of 0.3 Pa and a power of 130 W. The composition of the CrCON film, as determined by ESCA, was 42 atom % chromium, 5 atom % carbon, 43 atom % oxygen and 10 atom % nitrogen.

The change in substrate warp following deposition of the two films, relative to before film deposition, was measured with a FT-900 flatness tester (manufactured by Nidek Co., Ltd.). The value was 0.04 μm, which is very small. The total film stress for the two films, as calculated from the change in warp, was 0.03 GPa.

Example 2

A first CrCON film was deposited to a thickness of 25 nm on a 6-inch quartz substrate by DC sputtering. Chromium was used as the target, and the gases passed through the system were argon (5 scam), $CO_2$ (1.2 scam) and $N_2$ (1.6 scam). Other sputtering conditions included a gas pressure during discharge of 0.3 Pa and a power of 130 W. The composition of the first CrCON film, as determined by ESCA, was 42 atom % chromium, 5 atom % carbon, 43 atom % oxygen and 10 atom % nitrogen.

A CrCO film was deposited to a thickness of 70 nm on the CrCON film by DC sputtering. Chromium was used as the target, and the gases passed through the system were argon (5 scam) and $CO_2$ (0.4 scam). Other sputtering conditions included a gas pressure during discharge of 0.3 Pa and a power of 130 W. The composition of the CrCO film, as determined by ESCA, was 69 atom % chromium, 13 atom % carbon and 18 atom % oxygen.

Next, a second CrCON film was deposited to a thickness of 25 nm on the CrCO film by DC sputtering. Chromium was used as the target, and the gases passed through the system were argon (5 scam), $CO_2$ (1.2 scam) and $N_2$ (1.6 scam). Other sputtering conditions included a gas pressure during discharge of 0.3 Pa and a power of 130 W. The composition of the second CrCON film, as determined by ESCA, was 42 atom % chromium, 5 atom % carbon, 43 atom % oxygen and 10 atom % nitrogen.

The change in substrate warp following deposition of the three films relative to before film deposition was 0.03 μm, which is very small. The total film stress for the three films, as calculated from the change in warp, was 0.02 GPa.

Example 3

A first CrCON film was deposited to a thickness of 25 nm on a 6-inch quartz substrate by DC sputtering. Chromium was used as the target, and the gases passed through the system were argon (5 sccm), $CO_2$ (1.2 sccm) and $N_2$ (1.6 sccm). Other sputtering conditions included a gas pressure during discharge of 0.3 Pa and a power of 130 W. The composition of the first CrCON film, as determined by ESCA, was 42 atom % chromium, 5 atom % carbon, 43 atom % oxygen and 10 atom % nitrogen.

A second CrCON film was deposited to a thickness of 70 nm on the first CrCON film by DC sputtering. Chromium was used as the target, and the gases passed through the system were argon (5 sccm), $CO_2$ (0.4 sccm) and $N_2$ (0.4 sccm) Other sputtering conditions included a gas pressure during discharge of 0.3 Pa and a power of 130 W. The composition of the second CrCON film, as determined by ESCA, was 63 atom % chromium, 8 atom % carbon, 20 atom % oxygen, and 9 atom % nitrogen.

Next, a third CrCON film was deposited to a thickness of 25 nm on the second CrCON film by DC sputtering. Chromium was used as the target, and the gases passed through the system were argon (5 sccm), $CO_2$ (1.2 sccm) and $N_2$ (1.6 sccm). Other sputtering conditions included a gas pressure during discharge of 0.3 Pa and a power of 130 W. The composition of the third CrCON film, as determined by ESCA, was 42 atom % chromium, 5 atom % carbon, 43 atom % oxygen and 10 atom % nitrogen.

The change in substrate warp following deposition of the three films relative to before film deposition was 0.05 μm, which is very small. The total film stress for the three films, as calculated from the change in warp, was 0.04 GPa.

Example 4

A first CrCON film was deposited to a thickness of 70 nm on a 6-inch quartz substrate by DC sputtering. Chromium was used as the target, and the gases passed through the system were argon (5 sccm), $CO_2$ (0.4 sccm) and $N_2$ (0.4 sccm) Other sputtering conditions included a gas pressure during discharge of 0.3 Pa and a power of 130 W. The composition of the CrCON film, as determined by electron spectroscopy for chemical analysis (ESCA), was 63 atom % chromium, 8 atom % carbon, 20 atom % oxygen and 9 atom % nitrogen.

Next, a second CrCON film was deposited to a thickness of 25 nm on the first CrCON film by DC sputtering. Chromium was used as the target, and the gases passed through the system were argon (5 sccm), $CO_2$ (1.2 sccm) and $N_2$ (1.6 sccm). Other sputtering conditions included a gas pressure during discharge of 0.3 Pa and a power of 130 W. The composition of the second CrCON film, as determined by ESCA, was 42 atom % chromium, 5 atom % carbon, 43 atom % oxygen and 10 atom % nitrogen.

The change in substrate warp following deposition of the two films relative to before film deposition was 0.04 μm, which is very small. The total film stress for the two films, as calculated from the change in warp, was 0.03 GPa.

Comparative Example 1

A first CrCON film was deposited to a thickness of 25 nm on a 6-inch quartz substrate by DC sputtering. Chromium was used as the target, and the gases passed through the system were argon (5 sccm), $CO_2$ (1.2 sccm) and $N_2$ (1.6 sccm). Other sputtering conditions included a gas pressure during discharge of 0.3 Pa and a power of 130 W. The composition of the CrCON film, as determined by ESCA, was 42 atom % chromium, 5 atom % carbon, 43 atom % oxygen and 10 atom % nitrogen.

A chromium film was deposited to a thickness of 70 nm on the first CrCON film by DC sputtering. Chromium was used as the target, and the only gas passed through the system was argon (5 sccm). Other sputtering conditions included a gas pressure during discharge of 0.3 Pa and a power of 130 W.

Next, a second CrCON film was deposited to a thickness of 25 nm on the chromium film by DC sputtering. Chromium was used as the target, and the gases passed through the system were argon (5 sccm), $CO_2$ (1.2 sccm) and $N_2$ (1.6 sccm). Other sputtering conditions included a gas pressure during discharge of 0.3 Pa and a power of 130 W. The composition of the second CrCON film, as determined by ESCA, was 42 atom % chromium, 5 atom % carbon, 43 atom % oxygen and 10 atom % nitrogen.

The change in substrate warp following deposition of the three films relative to before film deposition was measured in the same way as in the other examples, whereupon a large value of 1.63 μm was obtained. The total film stress for the three films, as calculated from the change in warp, was 1.5 GPa.

TABLE 1

|  | EX 1 | EX 2 | EX 3 | EX 4 | CE 1 |
|---|---|---|---|---|---|
| First antireflective film | — | CrCON | CrCON | — | CrCON |
| Light-shielding film | CrCO | CrCO | CrCON | CrCON | Cr |
| Second antireflective film | CrCON | CrCON | CrCON | CrCON | CrCON |
| Change in substrate warp* ($\mu$m) | 0.04 | 0.03 | 0.05 | 0.04 | 1.63 |
| Film stress (GPa) | 0.03 | 0.02 | 0.04 | 0.03 | 1.5 |

*Difference between substrate warp after film deposition and substrate warp before film deposition.

The above results clearly demonstrate that the inventive photomask blank comprising at least one light-shielding film and at least one antireflective film on a transparent substrate minimizes film stress and substantially eliminates substrate warp following deposition of the light-shielding film and the antireflective film because each film is composed of a CrCO layer, a CrCON layer, or a combination of CrCO and CrCON layers. This enables accurate, distortion-free patterning to be achieved.

Japanese Patent Application No. 2000-124276 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

What is claimed is:

1. A photomask blank comprising a transparent substrate and, on the substrate, at least one light-shielding film and at least one antireflective film; wherein each film is composed of a CrCO layer, or a CrCON layer, or a combination of CrCO and CrCON layers.

2. The photomask blank of claim 1 having, in order from the substrate side, a CrCO layer as the light-shielding film and a CrCON layer as the antireflective film.

3. The photomask blank of claim 1 having, in order from the substrate side, a CrCON layer as the light-shielding film and a CrCON layer as the antireflective film.

4. The photomask blank of claim 1 having, in order from the substrate side, a CrCON layer as a first antireflective film, a CrCO layer as the light-shielding film, and a CrCON layer as a second antireflective film.

5. The photomask blank of claim 1 having, in order from the substrate side, a CrCON layer as a first antireflective film, a CrCON layer as the light-shielding film, and a CrCON layer as a second antireflective film.

6. The photomask blank of claim 1, wherein the light-shielding film and antireflective film have a combined film stress of not more than 0.2 GPa.

7. The photomask blank of claim 1, wherein the substrate has a change in warp following formation of the light-shielding film and the antireflective film, relative to before film formation, of not more than 0.2 $\mu$m.

8. A photomask fabricated by lithographically patterning the photomask blank of claim 1.

9. A photomask blank of claim 1 having, in order from the substrate side, a CrCO layer as the light-shielding film with a CrCO layer as the antireflective film.

10. A photomask blank of claim 1 having, in order from the substrate side, a CrCON layer as the light-shielding film with a CrCO layer as the antireflective film.

11. A photomask blank of claim 1 having, in order from the substrate side, a CrCO layer as the first antireflective film, a CrCO layer as the light-shielding film, and a CrCO layer as the second antireflective film.

12. A photomask blank of claim 1 having, in order from the substrate side, a CrCO layer as the first antireflective film, a CrCON layer as the light-shielding film, and a CrCO layer as the second antireflective film.

13. A photomask blank of claim 1 having, in order from the substrate side, a CrCON layer as the first antireflective film, a CrCON layer as the light-shielding film, and a CrCO layer as the second antireflective film.

14. A photomask blank of claim 1 having, in order from the substrate side, a CrCO layer as the first antireflective film, a CrCO layer as the light-shielding film, and a CrCON layer as the second antireflective film.

15. A photomask blank of claim 1 having, in order from the substrate side, a CrCO layer as the first antireflective film, a CrCON layer as the light-shielding film, and a CrCON layer as the second antireflective film.

16. A photomask blank of claim 1 having, in order from the substrate side, a CrCON layer as the first antireflective film, a CrCO layer as the light-shielding film, and a CrCO layer as the second antireflective film.

17. A photomask blank of claim 1, wherein each CrCO layer consists essentially of 1 to 20 atom % carbon and 5 to 60 atom % of oxygen, with the balance being chromium.

18. A photomask blank of claim 1, wherein each CrCON layer consists essentially of 1 to 20 atom % carbon, 5 to 60 atom % oxygen, and 1 to 60 atom % nitrogen, with the balance being chromium.

19. A photomask blank of claim 1, wherein the thickness of the light-shielding layer is 30–150 nm.

20. A photomask blank of claim 1, wherein the overall film stress for all the light-shielding films and antireflective films combined is 0–0.1 GPa.

* * * * *